(12) United States Patent
Floro et al.

(10) Patent No.: US 6,888,267 B2
(45) Date of Patent: May 3, 2005

(54) BATTERY BACKED MEMORY WITH LOW BATTERY VOLTAGE TRIP, DISCONNECT AND LOCKOUT

(75) Inventors: William Edward Floro, Willoughby, OH (US); Ronald Edwin Schultz, Solon, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 20 days.

(21) Appl. No.: 10/058,959

(22) Filed: Jan. 29, 2002

(65) Prior Publication Data

US 2003/0142573 A1 Jul. 31, 2003

(51) Int. Cl.[7] .................................................. H02J 7/00
(52) U.S. Cl. .............................. 307/66; 307/85; 702/63
(58) Field of Search .................................. 307/66, 130

(56) References Cited

U.S. PATENT DOCUMENTS

| | | | | |
|---|---|---|---|---|
| 4,634,936 A | * | 1/1987 | Gentry et al. ............... | 315/307 |
| 4,645,943 A | * | 2/1987 | Smith et al. ................. | 307/150 |
| 4,730,121 A | * | 3/1988 | Lee et al. ..................... | 307/66 |
| 4,841,474 A | * | 6/1989 | Zandveld et al. ............. | 307/66 |
| 5,073,837 A | * | 12/1991 | Baek ........................... | 361/92 |
| 5,193,176 A | * | 3/1993 | Brandin ....................... | 307/66 |
| 5,241,508 A | * | 8/1993 | Berenguel et al. .......... | 365/229 |
| 5,359,569 A | * | 10/1994 | Fujita et al. ................. | 365/229 |
| 5,557,777 A | * | 9/1996 | Culbert ......................... | 713/2 |
| 5,604,708 A | * | 2/1997 | Helms et al. ................ | 365/229 |
| 5,729,061 A | * | 3/1998 | Narita ......................... | 307/130 |
| 5,799,200 A | * | 8/1998 | Brant et al. ................. | 713/340 |
| 5,889,933 A | * | 3/1999 | Smith ........................... | 714/22 |
| 5,914,543 A | * | 6/1999 | Scherpenberg et al. ..... | 307/126 |
| 5,944,828 A | * | 8/1999 | Matsuoka .................... | 713/323 |
| 6,079,026 A | * | 6/2000 | Berglund et al. ........... | 713/340 |
| 6,362,541 B1 | * | 3/2002 | Kawata ....................... | 307/125 |
| 6,473,355 B2 | * | 10/2002 | Caulkins ..................... | 365/228 |
| 6,567,899 B2 | * | 5/2003 | Ghosh et al. ................ | 711/156 |

* cited by examiner

*Primary Examiner*—Robert L. Deberadinis
(74) *Attorney, Agent, or Firm*—Quarles & Brady LLP; R. Scott Speroff

(57) ABSTRACT

A memory system having power backup having memory circuits that may be set to a low power mode by means of volatile control registers, disconnects the memory circuits from the battery when low voltage conditions are detected so as to prevent reversion of the memory circuits to high current consumption modes such as would drain batteries after replacement.

17 Claims, 2 Drawing Sheets

BATTERY BACKED MEMORY WITH LOW BATTERY VOLTAGE TRIP, DISCONNECT AND LOCKOUT

CROSS-REFERENCE TO RELATED APPLICATIONS

—

STATEMENT REGARDING FEDERALLY SPONSORED RESEARCH OR DEVELOPMENT

—

BACKGROUND OF THE INVENTION

The invention relates generally to battery backed, electronic memory where the battery prevents loss of data during momentary power interruptions, and specifically to a battery backed memory suitable for use with memory integrated circuits providing for a low-power "powerdown" mode of operation.

Industrial controllers are special purpose computers used for the control of industrial processes and the like. While executing a stored program, they read inputs from the controlled process and, according to the logic of a contained control program, provide outputs to the control process.

Industrial controllers differ from regular computers both in that they provide "real-time" control (i.e., control in which control outputs are produced predictably and rapidly in response to given control inputs) and in that they provide for extremely reliable operation. In this latter regard, the volatile memory used by the industrial controller is often backed up with a battery so that data needed for the control program is not lost during momentary loss of line power. Volatile memory is that which requires power to maintain its stored data.

Such "battery backed" memory, using a combination of static random access memory (SRAM) and a long life battery such as a lithium cell, is well known. The lithium cell provides high power density and long life, but is not rechargeable, and must be replaced periodically.

In current control applications, synchronous dynamic random access memory (SDRAM) may be preferred to SRAM because of its higher density, faster speed, and lower cost. Unfortunately, the amount of power needed for SDRAM is much greater than that needed for conventional SRAM devices. For this reason, many SDRAMs provide at least two operating modes: a normal operating mode and a "powerdown" mode in which the power consumption by the SDRAM is significantly reduced while preserving data integrity. The powerdown mode may be activated by writing particular values to control registers within the SDRAM. The SDRAM may be set to powerdown mode by a microprocessor executing a program when main power is lost and it is known that battery backup will be required.

Despite the use of SDRAM having a powerdown mode, SDRAM battery backed systems may be plagued by high battery replacement rates.

BRIEF SUMMARY OF THE INVENTION

The present inventors have recognized that a routine replacement of batteries in a product with battery backed-up SDRAM can cause the registers used to set the SDRAM to powerdown, to be corrupted. Under such circumstances, and when line power is not immediately restored to the memory, the SDRAM operates in an unprogrammed state and quickly exhausts the replacement battery. This problem may also occur if there is a momentary drop in battery voltage, for whatever reason, sufficient to corrupt the SDRAM control registers.

The present invention addresses this problem by continuously monitoring battery voltage to the SDRAM and, if battery voltage drops sufficiently so as to raise the risk of the SDRAM's control registers being corrupted, the SDRAM is automatically disconnected from the battery power by means of a solid state switch. This disconnected state is preserved by a latch which is resettable, typically by the microprocessor that sets the SDRAM to powerdown mode. This invention is applicable not just to SDRAM but potentially to any volatile memory providing a powerdown mode controlled by volatile registers.

Specifically then, the present invention provides a battery backed memory system having a battery supply line receiving a battery voltage from a battery to provide backup voltage when a line voltage is lost. Volatile memory receives the battery voltage from the battery supply line as controlled by an electronically operated switch. The solid state memory has a low power operating mode controlled by volatile data held in the solid state memory. A voltage supervisory circuit communicates with the battery supply line, the volatile solid state memory, and the solid state switch to operate the switch in response to a predetermined level in battery voltage below a normal battery voltage to disconnect the battery supply line from the volatile memory.

Thus, it is one object of the invention to automatically disconnect the memory from battery power in circumstances where the memory may have reverted from powerdown mode to a high power consumption mode.

The memory system may include a latch connected between the voltage supervisory circuit and the solid state switch so that the solid state switch is latched to disconnect power even after restoration of battery voltage to the normal battery voltage. The latch may receive battery voltage from the battery supply line.

Thus it is another object of the invention to keep the memory disconnected even when battery voltage is restored but before powerdown mode has been re-established.

The supervisory circuit may receive battery voltage from the battery supply line via the electronically controlled switch.

Thus it is another object of the invention to reduce current drain caused by the supervisory circuit when the memory has also been disconnected.

The supervisory circuit may include a delay retaining its output signal of low voltage for a predetermined time after restoration of the battery voltage from below the predetermined level to the normal battery voltage.

Thus it is another object of the invention to ensure that the latch is cleared should it be inadvertently set during loss and return of power.

The battery backed memory may include a microprocessor communicating with the latch and executing a stored program to reset the latch under predetermined conditions of restoration of battery power.

Thus it is another object of the invention to allow for the resetting of the latch and reconnection of the memory under software control as part of a restoration of memory data or confirmation of memory integrity.

The foregoing objects and advantages may not apply to all embodiments of the inventions and are not intended to define the scope of the invention, for which purpose claims are provided. In the following description, reference is made to the accompanying drawings, which form a part hereof, and in which there is shown by way of illustration, a preferred embodiment of the invention. Such embodiment also does not define the scope of the invention and reference must be made therefore to the claims for this purpose.

DETAILED DESCRIPTION OF THE PREFERRED EMBODIMENT

Figure 1:
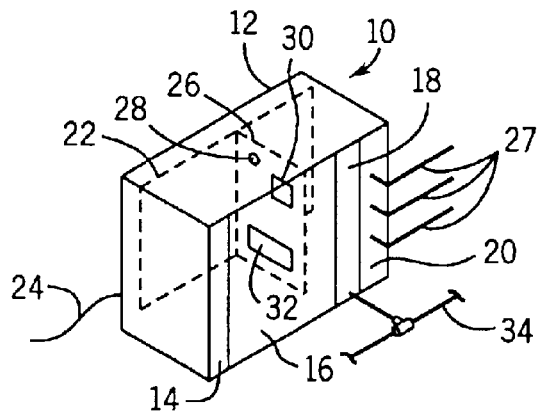
FIG. 1 is a simplified, perspective view in phantom of a processor board within an industrial controller such as may include battery backing up a volatile memory.

Referring now to FIG. 1, an industrial controller 10 may include a chassis 12 incorporating a number of modules 14, 16, 18, and 20 interconnected by means of backplane 22.

In particular, a power supply module 14 receives line power 24 and regulates the power for distribution along the backplane 22 to the other modules 16, 18, and 20. A processor module 16 receives data along the backplane 22 from a network module 18 or an I/O module 20. The network module 18 provides an interface with a communication network 34 such as EtherNet, or ControlNet to receive system control data or data from other I/O modules. The I/O module 20 provides an interface for input and output signals along I/O lines 27 communicating with the controlled process or machine. Generally, during operation of the industrial controller 10, a program executed by the processor module 16 reads this input data to create output data that is then returned along the backplane 22 from a network module 18 or an I/O module 20.

Figure 2:
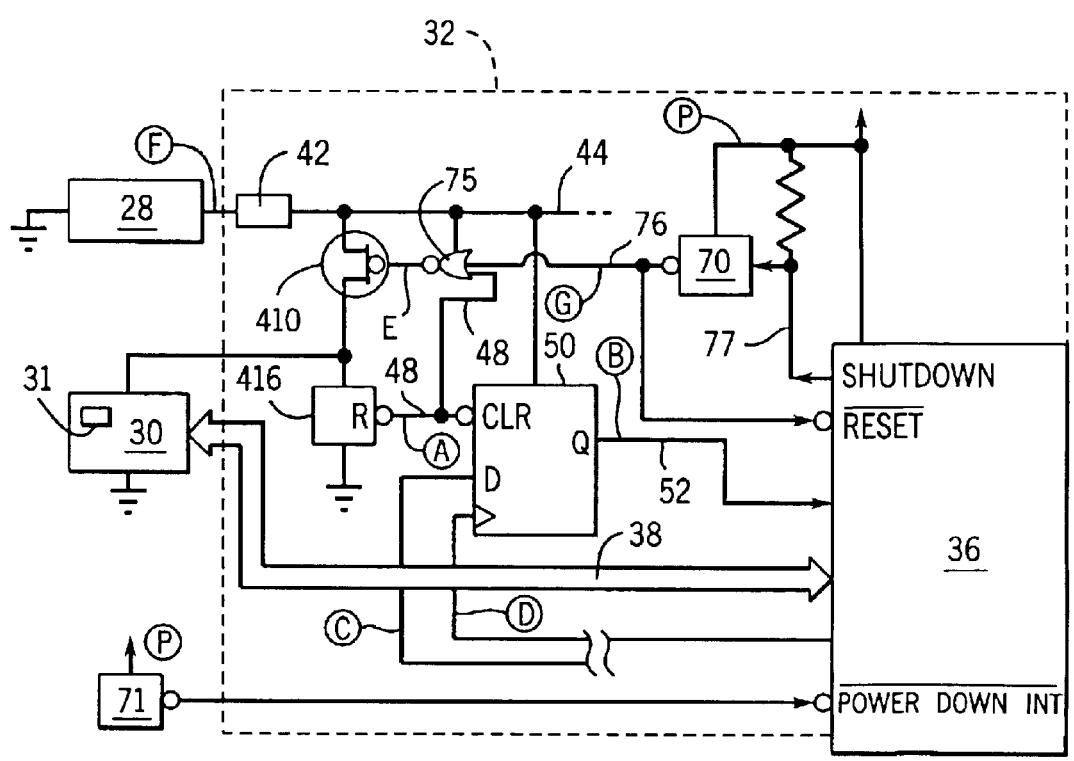
FIG. 2 is schematic representation of the circuitry of the processor board including a supervisory circuit monitoring battery voltage and providing a signal to a latch to disconnect the memory from the battery, the latch also communicating with a microprocessor.

Referring now to FIGS. 1 and 2, the processor module 16 includes an internal processor circuit board 26 containing a battery 28, volatile memory 30 and processor circuitry 32. The battery may be a lithium battery as is generally known in the art. Such batteries are not rechargeable and hence must be replaced when their power is exhausted. The volatile memory 30 may be synchronous dynamic random access memory (SDRAM) which requires application of power to maintain its memory state.

The volatile memory 30 may include internal registers 31 which may be set to limit the power consumption state of the memory 30, for example, by changing the internal frequency of the refresh clock or the like. In such a powerdown mode, data is preserved but normal reading and writing of the memory is typically not possible. The registers 31 like the remainder of the memory 30 are subject to data loss in the event that power to the memory 30 is dropped below a predetermined amount.

The processor circuitry 32 includes a microprocessor 36 communicating via an internal data and address bus 38 with the volatile memory 30 (including registers 31) and possibly other memory including non-volatile memory and the like. According to methods well known in the art, the microprocessor 36 reads or writes to the volatile memory 30 as is necessary to execute the control program. The microprocessor 36 may also communicate over bus 38, or via a similar mechanism, with the backplane 22 and hence with I/O modules 20 or network module 18. The microprocessor 36 receives power (P) from the power supply module 14.

Memory 30 receives power via solid state switch 40 (for example, a p-channel field effect transistor) from a power conditioning device 42 receiving power (F) from battery 28 and shifting it upward as with a DC-to-DC converter or downward as through standard regulation. The solid state switch 40 may also conduct power to the memory 30 received from line 44 from the power supply module 14 derived from line power 24 but independent of power (P). When the solid state switch 40 is on, and line power 24 is present, power flows exclusively from line 44. When the solid state switch 40 is on, and there is a loss of line power 24, power flows exclusively from battery 28 through power conditioning device 42.

Attached to the solid state switch 40, also to receive the power from the battery or line 44 through the solid state switch 40, is a supervisory circuit 46. Supervisory circuits, as are understood in the art, provide an internal voltage reference and a comparator so that they may compare the voltage of the power received, in this case from the battery 28, to that internal reference. In this case, the internal reference is set to a value above a minimum voltage at which the data stored in memory 30 is guaranteed not to be lost. If voltage drops below this predetermined level, which is normally substantially below the normal battery voltage (being the voltage of the battery 28 as possibly modified by power conditioning device 42), the supervisory circuit produces a reset signal (A) along line 48.

This reset signal (A) is received by a latch 50 at the CLEAR input of the latch so that when the reset signal (A) of the supervisory circuit transitions to a low level, the output (B) of the latch 50 at line 52 moves to a low level. The output (B) may be monitored by a program executing on the microprocessor 36 and used by the microprocessor 36 upon restoration of line power (P) to determine whether the data of the memory 30 is likely valid. The latch itself 50 receives power directly from the battery 28 or line 44, upstream of the solid state switch 40, and thus is not affected by this disconnection of power to devices 30 and 46. At least one of the DATA and CLOCK lines of the latch 50 indicated as lines (C) and (D), respectively, are controlled directly or indirectly from the microprocessor 36 and thus used to set the latch 50 so that the output (B) of the latch 50 at line 52 moves to a high level.

The reset signal (A) is also connected to one input of NOR gate 75. As such, whenever the supervisory circuit 46 output is high, the solid state switch 40 will be on to provide power from either the battery 28 or line 44 to memories 30 and itself.

The second input 76 of NOR gate 75 comes from a reset circuit 70. The output of the reset circuit 70 goes low whenever its power voltage drops below what is needed for microprocessor 36 and associated circuitry to function normally while powered up. In addition, if microprocessor 36 asserts its shutdown output 77 that connects to the manual reset of the reset circuit 70, the reset output 76 will go low regardless of the power supplied to the reset circuit 70.

If either the supervisory circuit 46 or the reset circuit 70 have valid voltages and put their output to high, the output of the NOR gate 75 will go low and solid state switch 40 will turn on. This provides power to memories 30 if there is adequate battery voltage or voltage at line 44.

There is also a "latching" mechanism that is separate from latch 50. While powered down with valid battery voltage, the input 76 of NOR gate 75 will be low but input 48 of NOR gate 75 will be high which keeps solid state switch 40 on. However, when battery voltage is lost, the input 48 of NOR gate 75 goes low which turns off solid state switch 40. Now if a new battery 28 is plugged in, no power will reach supervisory chip 46 because solid state switch 40 is off. Both inputs of NOR 75 will remain low which continues to keep solid state switch 40 "latched" off. At a later time, a power up will cause 76 input of NOR gate 75 to go high which will turn on solid state switch 40 and apply power to supervisory circuit 46. Input 48 of NOR gate 75 then goes high which will keep solid state switch 40 on during the next power down if there is sufficient battery voltage.

Figure 3:
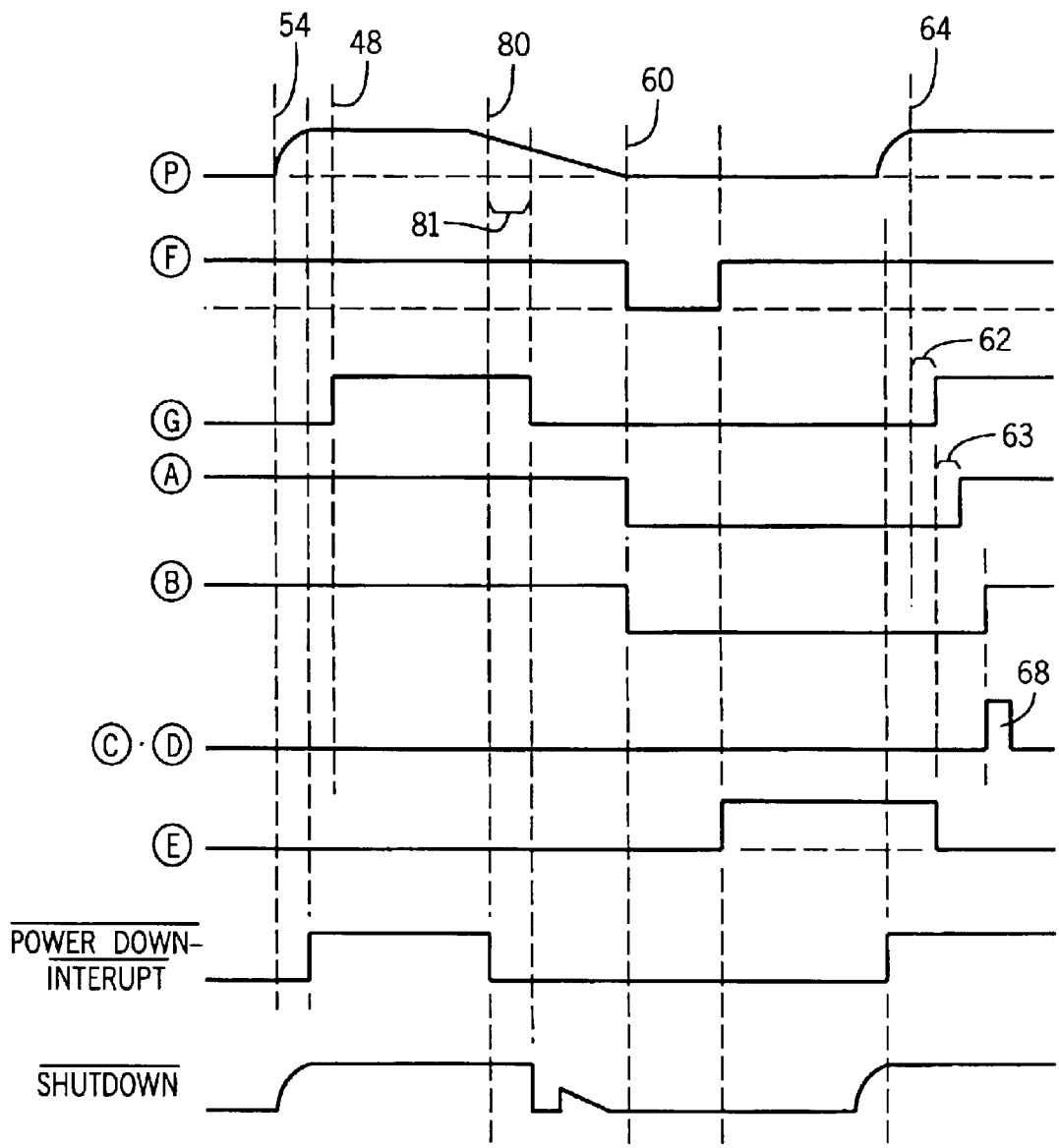
FIG. 3 is a timing diagram showing the signals at different points in the schematic of FIG. 2 during a restoration of power and an unanticipated power loss.

Referring now to FIGS. 2 and 3, power may be applied to the circuitry of FIG. 2 at time 54, for example, during a normal "booting" of the processor module 16. During the boot process, after line power (P) is valid, the reset circuit 70 will drive (G) reset high at time 48 which would drive (E) low, but if battery voltage has remained above the trip threshold of supervisory circuit 46 then line 48 will already be high as shown as (A) in FIG. 3 and (E) will be low. Since supervisor circuit output (A) has remained high, the latch output (B) is high. With reset at microprocessor 36 equal to high, the microprocessor 36 begins normal operation.

At a later time when power from (P) begins to decay, the low power warning circuit 71 will detect this and give a power down interrupt (PDI) to the microprocessor 36 at time 80 which indicates that power will soon be lost. The microprocessor during period 81 writes to the register 31 of memory 30 and puts them in the "powerdown" low power consumption mode. The microprocessor 36 then asserts the shutdown line 77 to low which causes the reset circuit 70 to put the microprocessor 36 and associated circuitry into reset.

Since the supervisory circuit 46 has valid power (F), the solid state switch 40 will remain on and the memories 30 will have battery power 28 when power from the line 44 decays because battery power 28 will continue to power supervisory chip 46 as well as memory 30.

At a later time 60, power (F) may be lost from the battery 28, the latter occurring, for example, during a replacement of the battery by the user or through other operating circumstances. Upon this power loss at time 60, the supervisory circuit 46 produces a low state on output 48 clearing the latch 50 that will indicate on the next power up that the registers 31 may have lost their data and that the memory 30, if previously set to "powerdown mode", may have lost this mode of operating.

The power (F) may be intermittent during this loss and the restoration of power on line 44 may cause latch 50 on a random basis to initialize in a set state with line 52 high. For this reason, each time the power is restored (for example at time 64), the reset circuit 70 holds its low state 62 for a predetermined interval after power transitions from a low to a normal voltage state. When the output 76 (G) of the reset circuit 70 goes high after this predetermined interval 62 (shown in FIG. 3) the output (E) of NOR gate 75 then goes low which turns on transistor 40. This provides power 44 to supervisory circuit 46 which then keeps its output 48 low for a predetermined interval 63 (also shown in FIG. 3). Low intervals 62 and then 63 on FIG. 3 on the clear input of the latch 50 assure that its output 52 will be low during power up and then as an input to microprocessor 36 when it comes out of reset. This low input 52 indicated that while powered down, the memories 30 had sufficient voltage 28 to preserve the integrity of their data.

In these cases, where the battery power (F) is lost during power down, the gate of the solid state switch 40 will become high turning the solid state switch 40 off disconnecting the battery 28 and power conditioning device 42 from the memory 30.

As shown, the output of the latch 50 may also be read by the microprocessor 36 which may use this output as an indication that memory 30 is corrupted. Generally, however, the microprocessor 36 will have been reset by a power loss and need not read the latch 50 to begin the boot process. If microprocessor 36 reads a low input from latch output 52 it may set a bit in a status register for the user to access via I/O module 20 or network module 18, and/or it may light an indicator on the front of the processor module 16 informing the user that memory contents may be corrupt. After providing feedback to the user, microprocessor 36 can then set the latch 50 by a pulsing of lines (C) and (D) producing pulse 68.

The terms "set" and "reset" as used herein and in the claims refer to logical states and are not intended to be limited to particular voltages, relative voltages, or a system of only positive or negative Boolean logic. Further, while the present invention is described with respect to battery back-up it will be understood that it is also applicable to back-up using other sources of power such as solar cells, fuel cells, generators, capacitors and the like.

It is specifically intended that the present invention not be limited to the embodiments and illustrations contained herein, but that modified forms of those embodiments including portions of the embodiments and combinations of elements of different embodiments also be included as come within the scope of the following claims.

We claim:

1. A memory system having power backup comprising:
   a backup supply line receiving a backup voltage when a line voltage is lost;
   an electronically controlled switch;
   volatile memory receiving voltage from the backup supply line controlled by the electronically controlled switch, the memory providing a low power operating mode controlled by volatile data held in the memory;
   a voltage supervisory circuit communicating with the backup supply line, the volatile memory, and the electronically controlled switch to operate the electronically controlled switch in response to a predetermined level in backup voltage below a normal backup voltage to disconnect the backup supply line from the volatile memory; and
   further including a latching means connected between the voltage supervisory circuit and the electronically controlled switch whereby the electronically controlled switch is latched to disconnect the backup supply line from the volatile memory even after restoration of backup voltage to the normal backup voltage while the memory system is not receiving line voltage.

2. The memory system of claim 1 including further a backup voltage source connected to the backup supply line selected from the group consisting of a: battery, fuel cell, solar cell, generator, and capacitor.

3. The memory system of claim 1 further wherein the volatile memory is dynamic random access memory.

4. The memory system of claim 1 wherein the latch means is a logic gate having one input tracking the output of the controlled switch, that input remaining low while when the electronically controlled switch has disconnected the backup supply line from the volatile memory.

5. The memory system of claim 4 wherein the logic gate has a second input derived from the line power to cause the reconnection of the backup supply line to the volatile memory by the electronic switch when line power is present.

6. The memory system of claim 1 wherein the voltage supervisory circuit receives backup voltage from the backup supply line via the electronically controlled switch.

7. The memory system of claim 1 further including:

a microprocessor; and wherein the latching means connected between the voltage supervisory circuit and the microprocessor provides a signal to the microprocessor indicating that the backup supply line has previously been disconnected from the volatile memory even after the backup supply line has been reconnected to the volatile memory while the memory system is not receiving line voltage;

whereby a control program executed on the microprocessor can determine after a power up the integrity of data in the volatile memory.

8. The memory system of claim 7 wherein the microprocessor executes the stored program to reset the latch after restoration of line power.

9. The memory system of claim 1 further including:

a microprocessor communicating with the volatile memory;

a low power warning circuit indicating a reduction of line power; and wherein the microprocessor executes a control program to read a low power warning signal from the low power warning circuit and in response to that signal to write to the volatile memory the volatile data to put the volatile memory into the low power operating mode.

10. The memory system of claim 1 wherein the backup voltage is from a battery and further including a voltage conversion device connected between the battery and the volatile memory.

11. A method of operating a memory system having a backup supply line providing backup voltage when a line voltage is lost, the memory system having an electronically controlled switch, a volatile memory receiving backup voltage from the backup supply line controlled by the electronically controlled switch, the volatile memory providing a low power operating mode controlled by volatile data held in the volatile memory; the method comprising the steps of:

(a) monitoring the voltage of the backup supply line;

(b) in response to a predetermined level in backup voltage below a normal backup voltage, disconnecting the backup supply line from the volatile memory using the electronically controlled switch; and (c) latching a signal controlling the electronically controlled switch thereby disconnecting the backup supply line from the volatile memory even after restoration of backup voltage to the normal backup voltage.

12. The method of claim 11 further including the step of connecting the backup supply line to a power source selected from the group consisting of a: battery, fuel cell, solar cell, generator, and capacitor.

13. The method of claim 11, including the step of unlatching the signal controlling the electronically controlled switch, thereby reconnecting the backup supply line to the volatile memory, after restoration of line voltage.

14. The method of claim 11 wherein the step of monitoring the voltage of the backup supply line is performed by a supervisory circuit receiving backup voltage from the backup supply line via the electronically controlled switch.

15. The method of claim 11 wherein the memory system further includes a microprocessor and including the step of latching a signal to the microprocessor indicating that the backup supply line has been disconnected from the volatile memory even after power from the backup supply line has been restored to the volatile memory while the memory system is not receiving line voltage.

16. The method of claim 15 including the step of unlatching the signal to the microprocessor the latch after restoration of line power.

17. The method of claim 11 including the steps of:

detecting a reduction of line power; and in response to the reduction, writing to the volatile memory the volatile data to put the volatile memory into the low power operating mode.

* * * * *